US006436768B1

(12) United States Patent
Yang et al.

(10) Patent No.: US 6,436,768 B1
(45) Date of Patent: Aug. 20, 2002

(54) SOURCE DRAIN IMPLANT DURING ONO FORMATION FOR IMPROVED ISOLATION OF SONOS DEVICES

(75) Inventors: Jean Yee-Mei Yang; Mark T. Ramsbey, both of Sunnyvale; Emmanuil Manos Lingunis, San Jose; Yider Wu, San Jose; Tazrien Kamal, San Jose; Yi He, Sunnyvale; Edward Hsia, Saratoga; Hidehiko Shiraiwa, San Jose, all of CA (US)

(73) Assignees: Advanced Micro Devices, Inc., Sunnyvale, CA (US); Fujitsu Limited (JP)

( * ) Notice: Subject to any disclaimer, the term of this patent is extended or adjusted under 35 U.S.C. 154(b) by 0 days.

(21) Appl. No.: 09/893,279

(22) Filed: Jun. 27, 2001

(51) Int. Cl.[7] .............................................. H01L 21/336
(52) U.S. Cl. ...................................... 438/266; 438/257
(58) Field of Search ................................ 438/257, 258, 438/266, 551, 593, 594, 680, 663, 706, 745, 770, 773, 954

(56) References Cited

U.S. PATENT DOCUMENTS

| 4,173,766 A | 11/1979 | Hayes | 357/23 |
| 5,168,334 A | 12/1992 | Mitchell et al. | 257/324 |
| 5,349,221 A | 9/1994 | Shimoji | 257/324 |

(List continued on next page.)

FOREIGN PATENT DOCUMENTS

| WO | WO9960631 | 5/1999 | ......... H01L/29/792 |

OTHER PUBLICATIONS

"A True Single–Transistor Oxide–Nitride–Oxide EEPROM Device," T.Y. Chan, et al., IEEE Electron Device Letters, vol. EDL 8, No. 3, Mar. 1987.

"An Electrically Alterable Nonvolatile Memory Cell Using a Floating–Gate Structure," Daniel C. Guterman, et al., IEEE Transactions on Electron Devices, vol. ED–26, No. 4, Apr. 1979.

"NROM: A Novel Localized Trapping, 2–Bit Nonvolatile Memory Cell," Boaz Eitan, et al., IEEE Electron Device Letters, vol. 21, No. 11 Nov. 2000.

*Primary Examiner*—David Nelms
*Assistant Examiner*—David Nhu
(74) *Attorney, Agent, or Firm*—Amin & Turocy, LLP

(57) ABSTRACT

One aspect of the present invention relates to a method of forming a SONOS type non-volatile semiconductor memory device, involving forming a first layer of a charge trapping dielectric on a semiconductor substrate; forming a second layer of the charge trapping dielectric over the first layer of the charge trapping dielectric on the semiconductor substrate; optionally at least partially forming a third layer of the charge trapping dielectric over the second layer of the charge trapping dielectric on the semiconductor substrate; optionally removing the third layer of the charge trapping dielectric; forming a source/drain mask over the charge trapping dielectric; implanting a source/drain implant through the charge trapping dielectric into the semiconductor substrate; optionally removing the third layer of the charge trapping dielectric; and one of forming the third layer of the charge trapping dielectric over the second layer of the charge trapping dielectric on the semiconductor substrate, reforming the third layer of the charge trapping dielectric over the second layer of the charge trapping dielectric on the semiconductor substrate, or forming additional material over the third layer of the charge trapping dielectric.

22 Claims, 5 Drawing Sheets

U.S. PATENT DOCUMENTS

| | | | |
|---|---|---|---|
| 5,585,293 A | * 12/1996 | Sharma et al. | 438/266 |
| 5,644,533 A | 7/1997 | Lancaster et al. | 365/185.18 |
| 5,768,192 A | 6/1998 | Eitan | 365/185.24 |
| 5,774,400 A | * 6/1998 | Lancaster et al. | 365/185.3 |
| 5,825,686 A | 10/1998 | Schmitt-Landsiedel et al. | 365/185.03 |
| 5,963,465 A | 10/1999 | Eitan | 365/63 |
| 5,966,603 A | 10/1999 | Eitan | 438/258 |
| 6,001,709 A | 12/1999 | Chuang et al. | 438/440 |
| 6,011,725 A | 1/2000 | Eitan | 365/185.33 |
| 6,030,871 A | 2/2000 | Eitan | 438/276 |
| 6,117,730 A | 9/2000 | Komori et al. | 438/258 |

* cited by examiner

SOURCE DRAIN IMPLANT DURING ONO FORMATION FOR IMPROVED ISOLATION OF SONOS DEVICES

TECHNICAL FIELD

The present invention generally relates to fabricating SONOS type nonvolatile memory semiconductor devices. In particular, the present invention relates to improved methods of fabricating the source/drain regions and the charge trapping dielectric of SONOS type nonvolatile memory semiconductor devices.

BACKGROUND ART

Conventional floating gate flash memory types of EEPROMs (electrically erasable programmable read only memory), employ a memory cell characterized by a vertical stack of a tunnel oxide, a first polysilicon layer over the tunnel oxide, an ONO (oxide-nitride-oxide) interlevel dielectric over the first polysilicon layer, and a second polysilicon layer over the ONO interlevel dielectric. For example, Guterman et al (IEEE Transactions on Electron Devices, Vol. 26, No. 4, p. 576, 1979) relates to a floating gate nonvolatile memory cell consisting of a floating gate sandwiched between a gate oxide and an interlevel oxide, with a control gate over the interlevel oxide.

Generally speaking, a flash memory cell is programmed by inducing hot electron injection from a portion of the substrate, such as the channel section near the drain region, to the floating gate. Electron injection carries negative charge into the floating gate. The injection mechanism can be induced by grounding the source region and a bulk portion of the substrate and applying a relatively high positive voltage to the control electrode to create an electron attracting field and applying a positive voltage of moderate magnitude to the drain region in order to generate "hot" (high energy) electrons. After sufficient negative charge accumulates on the floating gate, the negative potential of the floating gate raises the threshold voltage of its field effect transistor (FET) and inhibits current flow through the channel region through a subsequent "read" mode. The magnitude of the read current is used to determine whether or not a flash memory cell is programmed. The act of discharging the floating gate of a flash memory cell is called the erase function. The erase function is typically carried out by a Fowler-Nordheim tunneling mechanism between the floating gate and the source region of the transistor (source erase or negative gate erase) or between the floating gate and the substrate (channel erase). A source erase operation is induced by applying a high positive voltage to the source region and grounding the control gate and the substrate while floating the drain of the respective memory cell.

Subsequently, SONOS (Silicon Oxide Nitride Oxide Silicon) type memory devices have been introduced. See Chan et al, IEEE Electron Device Letters, Vol. 8, No. 3, p. 93, 1987. SONOS type flash memory cells are constructed having a charge trapping non-conducting dielectric layer, typically a silicon nitride layer, sandwiched between two silicon dioxide layers (insulating layers). The nonconducting dielectric layer functions as an electrical charge trapping medium. A conducting gate layer is placed over the upper silicon dioxide layer. Since the electrical charge is trapped locally near whichever side that is used as the drain, this structure can be described as a two-transistor cell, or two-bits per cell. If multi-level is used, then four or more bits per cell can be accomplished. Multi-bit cells enable SONOS type memory devices to have the advantage over others in facilitating the continuing trend increasing the amount of information held/processed on an integrated circuit chip.

For simplicity, a two-bit per cell implementation of SONOS is described. While both bits of SONOS type memory devices are programmed in a conventional manner, such as using hot electron programming, each bit is read in a direction opposite that in which it is programmed with a relatively low gate voltage. For example, the right bit is programmed conventionally by applying programming voltages to the gate and the drain while the source is grounded or at a lower voltage. Hot electrons are accelerated sufficiently so that they are injected into a region of the trapping dielectric layer near the drain. The device, however, is read in the opposite direction from which it is written, meaning voltages are applied to the gate and the source while the drain is grounded or at a lower voltage. The left bit is similarly programmed and read by swapping the functionality of source and drain terminals. Programming one of the bits leaves the other bit with its information intact.

Reading in the reverse direction is most effective when relatively low gate voltages are used. A benefit of utilizing relatively low gate voltages in combination with reading in the reverse direction is that the potential drop across the portion of the channel beneath the trapped charge region is significantly reduced. A relatively small programming region or charge trapping region is possible due to the lower channel potential drop under the charge trapping region. This permits much faster programming times because the effect of the charge trapped in the localized trapping region is amplified. Programming times are reduced while the delta in threshold voltage between the programmed versus unprogrammed states remains the same as when the device is read in the forward direction.

SONOS type memory devices offer additional advantages as well. In particular, the erase mechanism of the memory cell is greatly enhanced. Both bits of the memory cell can be erased by applying suitable erase voltages to the gate and the drain for the right bit and to the gate and the source for the left bit. Another advantage includes reduced wearout from cycling thus increasing device longevity. An effect of reading in the reverse direction is that a much higher threshold voltage for the same amount of programming is possible. Thus, to achieve a sufficient delta in the threshold voltage between the programmed and unprogrammed states of the memory cell, a much smaller region of trapped charge is required when the cell is read in the reverse direction than when the cell is read in the forward direction.

The erase mechanism is enhanced when the charge trapping region is made as narrow as possible. Programming in the forward direction and reading in the reverse direction permits limiting the width of the charge trapping region to a narrow region near the drain (right bit) or the source. This allows for much more efficient erasing of the memory cell.

Another advantage of localized charge trapping is that during erase, the region of the nitride away from the drain does not experience deep depletion since the erase occurs near the drain only. The final threshold of the cell after erasing is self limited by the device structure itself. This is in direct contrast to conventional single transistor floating gate flash memory cells which often have deep depletion problems.

Although many advantages are described above, there are some disadvantages associated with SONOS type memory devices. In some instances, it is difficult to form the charge trapping layer over a silicon substrate or gate oxide layer with preciseness and uniformity, high quality (no defects), and without contamination. Such a constitution presents challenges for precisely and uniformly forming ONO sublayers having predetermined thicknesses.

Moreover, a well formed ONO dielectric provides adequate poly to source/drain isolation. Contamination and dopants/implants that undesirably become incorporated into an ONO dielectric decrease the poly to source/drain isolation, thereby decreasing the reliability of the memory devices made therewith. This is especially a concern if attempts are made to form bitlines by implanting source/drains after the ONO dielectric is formed. However, if the source/drains are implanted prior to forming the ONO dielectric, unwanted excessive diffusion of the implants occurs. This is because there are several thermal cycles associated with making and annealing the ONO dielectric. There is an unmet need for SONOS type nonvolatile memory devices having both improved poly to source/drain isolation and little or no excessive diffusion of implants.

SUMMARY OF THE INVENTION

The present invention provides a simplified process for fabricating SONOS type nonvolatile memory devices, and in particular, a simplified process for forming charge trapping dielectrics and source/drains in SONOS type nonvolatile memory devices. The SONOS type nonvolatile memory devices lead to the efficient production of dense, robust single-poly nonvolatile memory devices. The present invention minimizes defects, contamination, and cost commonly associated with ONO formation in the core region, improves poly to source/drain isolation, and mitigates excessive diffusion of source/drain implants. The present invention also leads to the formation of charge trapping dielectrics having uniform and precise thickness while improved scaling.

One aspect of the present invention relates to a method of forming a SONOS type non-volatile semiconductor memory device, involving forming a first layer of a charge trapping dielectric on a semiconductor substrate; forming a second layer of the charge trapping dielectric over the first layer of the charge trapping dielectric on the semiconductor substrate; optionally at least partially forming a third layer of the charge trapping dielectric over the second layer of the charge trapping dielectric on the semiconductor substrate; optionally removing the third layer of the charge trapping dielectric, if present; forming a source/drain mask over the charge trapping dielectric; implanting a source/drain implant through the charge trapping dielectric into the semiconductor substrate; optionally removing the third layer of the charge trapping dielectric, if present; and one of forming the third layer of the charge trapping dielectric over the second layer of the charge trapping dielectric on the semiconductor substrate, reforming the third layer of the charge trapping dielectric over the second layer of the charge trapping dielectric on the semiconductor substrate, or forming additional material over the third layer of the charge trapping dielectric.

DISCLOSURE OF INVENTION

In describing various aspects of the present invention, cascading ranges are employed. It is understood that the high or low figure of one of such cascading ranges may be used with the high or low figure of another of such cascading ranges.

The present invention involves a process for fabricating SONOS type nonvolatile memory devices, and in particular, an improved process for forming the source/drain regions and the charge trapping dielectric in SONOS type nonvolatile memory devices. As a result, the SONOS type memory cells have an improved poly to source/drain isolation, little or no excessive diffusion of source/drain implants, and/or a charge trapping dielectric with precise thickness and minimal, if any, defects or contamination.

In SONOS type memory cells, the charge trapping dielectric functions by storing one or two bits therein. Since the charge storage features of the charge trapping dielectric influence the quality and reliability of SONOS type nonvolatile memory devices, it is important to properly form the charge trapping dielectric. The present invention provides SONOS type memory cells having charge trapping dielectrics with precise thickness and minimal defects by forming source/drain regions and the charge trapping dielectric using a source/drain mask and/or forming at least additional top layer of the charge trapping dielectric (typically the top oxide layer).

Generally speaking, the present invention involves forming or partially forming the charge trapping dielectric over at least the core region of a memory substrate. Partially forming the charge trapping dielectric involves partially or not completely forming the top layer, such as not completely forming the top oxide of an ONO charge trapping dielectric. In this connection, the top layer may be partially formed or not formed at all. If present, the top layer of the charge trapping dielectric or partially formed charge trapping dielectric is optionally removed. Source/drain implants are implanted into the core region of the substrate. If present, the top layer of the charge trapping dielectric or partially formed charge trapping dielectric is optionally removed. A new or additional top layer material is formed to provide a charge trapping dielectric over the source/drain implanted core region. As a result, an improved poly to source/drain isolation is provided, as well as mitigation of excessive source/drain diffusion that is typically caused by forming the charge trapping layer after the source/drain implant is performed.

Figure 1:
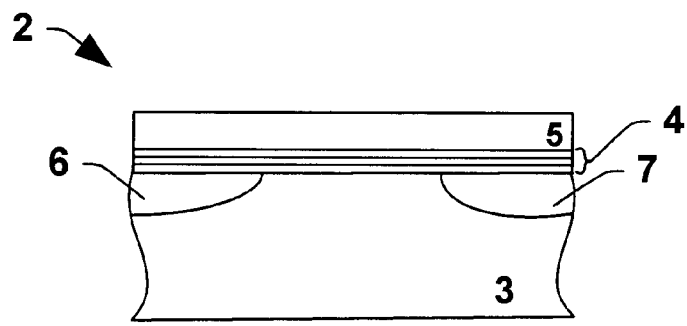
FIG. 1 illustrates a cross-sectional view of a SONOS type memory cell in accordance with one aspect of the invention.

Referring to FIG. 1, a SONOS type memory cell is shown. A charge trapping dielectric 4 is positioned over the silicon substrate 3, and a poly layer 5 is positioned over the charge trapping dielectric 4. Source 6 and drain 7 regions are positioned within the substrate 3 near the edges of the cell 2. As shown the charge trapping dielectric 4 contains three layers; namely, a first silicon dioxide layer, a silicon nitride layer, and a second silicon dioxide layer (an ONO charge trapping dielectric). Particularly in the case of an ONO dielectric, the electron trapping is in the silicon nitride layer.

The charge trapping dielectric may be any dielectric layer or layers that are capable of or facilitate electron trapping. In other words, to facilitate electron trapping, the charge trapping dielectric has a layer with a lower barrier height than the layers sandwiching it (two layers with relatively higher barrier heights sandwiching a layer with a relatively lower barrier height). In the case of an ONO trilayer dielectric, the oxide layers have a barrier height of about 3.1 eV whereas the nitride layer has a barrier height of about 2.1 eV. In this connection, a well is created in the middle layer.

Examples of charge trapping dielectrics include an ONO trilayer dielectric, an oxide/nitride bilayer dielectric, a nitride/oxide bilayer dielectric, an oxide/tantalum oxide bilayer dielectric ($SiO_2/Ta_2O_5$), an oxide/tantalum oxide/oxide trilayer dielectric ($SiO_2/Ta_2O_5/SiO_2$), an oxide/strontium titanate bilayer dielectric ($SiO_2/SrTiO_3$), an oxide/barium strontium titanate bilayer dielectric ($SiO_2/BaSrTiO_2$), an oxide/strontium titanate/oxide trilayer dielectric ($SiO_2/SrTiO_3/SiO_2$), an oxide/strontium titanate/barium strontium titanate trilayer dielectric ($SiO_2/SrTiO_3/BaSrTiO_2$), an oxide/hafnium oxide/oxide trilayer dielectric, and the like (in each case, the first layer mentioned is the bottom layer while the last layer mentioned is the top layer). Although the term SONOS type nonvolatile memory device is often used herein, it is to be understood that a SONOS type nonvolatile memory device as used herein may contain any of the charge trapping dielectrics described above. In other words, a SONOS type nonvolatile memory device contains any dielectric layer or layers that are capable of or facilitate electron trapping, and the SONOS type nonvolatile memory device contains an ONO charge trapping dielectric only when a specific reference to such dielectric is indicated.

Moreover, in the embodiments where the charge trapping dielectric is an ONO dielectric, one or both of the silicon dioxide layers may be a silicon-rich silicon dioxide layer. One or both of the silicon dioxide layers may also be an oxygen-rich silicon dioxide layer. One or both of the silicon dioxide layers may be a thermally grown or a deposited oxide. One or both of the silicon dioxide layers may be nitrided oxide layers. The nitride may be a silicon-rich silicon nitride layer or a silicon nitride containing oxygen. The nitride may also be an nitrogen-rich silicon nitride layer.

In one embodiment, the charge trapping dielectric 16 has a thickness from about 75 Å to about 300 Å. In another embodiment, the charge trapping dielectric 16 has a thickness from about 100 Å to about 275 Å. In yet another embodiment, the charge trapping dielectric 16 has a thickness from about 110 Å to about 250 Å.

In this connection, in one embodiment, in an ONO charge trapping dielectric the oxide layers individually have thicknesses from about 50 Å to about 150 Å while the nitride layer has a thickness from about 20 Å to about 100 Å. In another embodiment, the oxide layers individually have thicknesses from about 60 Å to about 140 Å while the nitride layer has a thickness from about 25 Å to about 95 Å. In yet another embodiment, the oxide layers individually have thicknesses from about 70 Å to about 130 Å while the nitride layer has a thickness from about 30 Å to about 90 Å.

Figure 2:
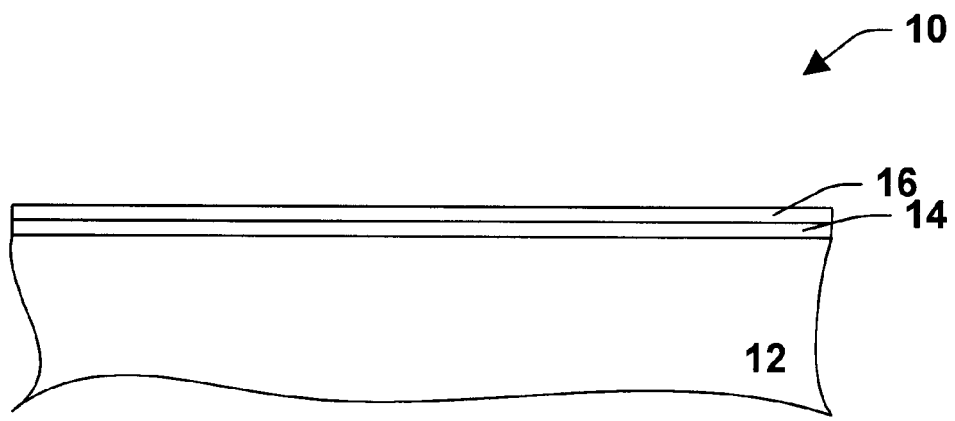
FIG. 2 illustrates a cross-sectional view of a first method of forming a SONOS type nonvolatile memory device in accordance with one aspect of the present invention.
Figure 3:
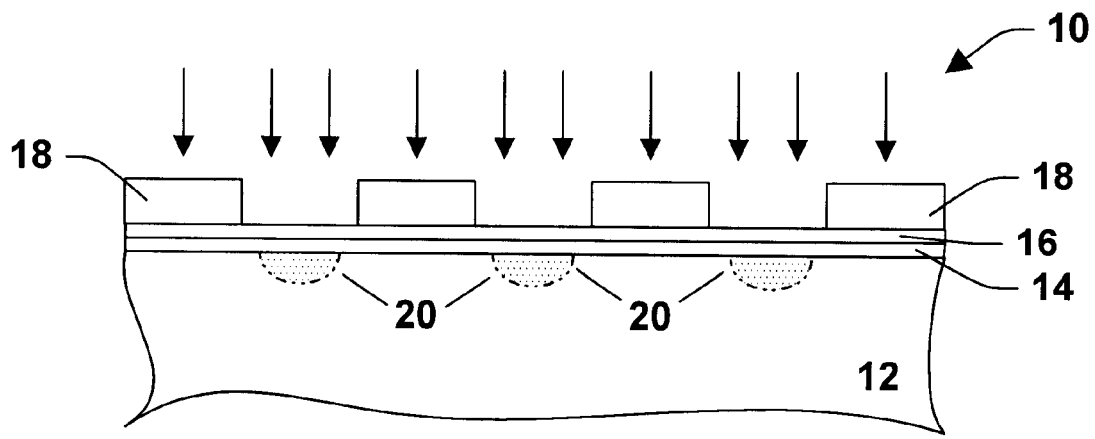
FIG. 3 illustrates another cross-sectional view of a first method of forming a SONOS type nonvolatile memory device in accordance with one aspect of the present invention.
Figure 4:
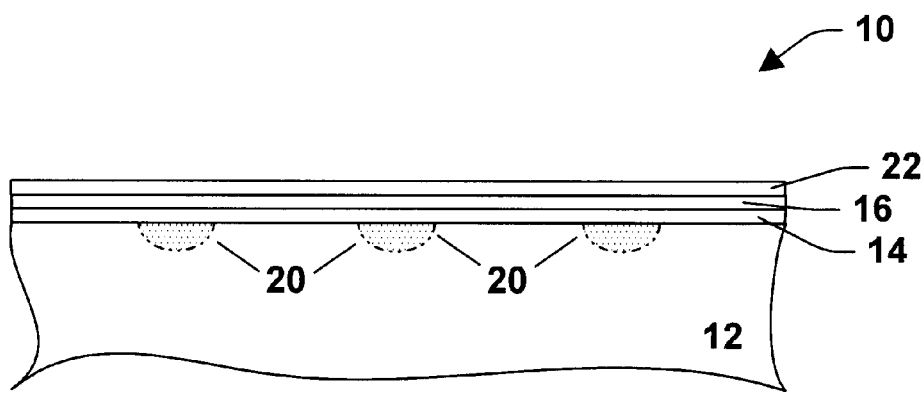
FIG. 4 illustrates yet another cross-sectional view of a first method of forming a SONOS type nonvolatile memory device in accordance with one aspect of the present invention.

Referring to FIGS. 2 to 4, one aspect of the present invention is specifically described. Referring specifically to FIG. 2, a semiconductor structure 10 is shown. Semiconductor substrate 12 contains two regions, the core region containing the memory cells and the periphery region containing the rest of the chip such as the controlling logic and input/output devices. Processing activity in the core region is highlighted in FIGS. 2 to 4.

A silicon dioxide layer 14 is formed over the silicon substrate 12. The silicon dioxide layer 14 is provided using any suitable means, such as chemical vapor deposition (CVD), including low pressure chemical vapor deposition (LPCVD) and plasma enhanced chemical vapor deposition (PECVD), dry oxidation, wet oxidation or rapid thermal oxidation. A silicon nitride layer 16 is formed over the silicon dioxide layer 14. The silicon nitride layer 16 is provided using any suitable means, such as CVD, including LPCVD and PECVD.

Referring to FIG. 3, a source/drain mask 18 is provided over the silicon nitride layer 16 by any suitable means. For example, a photoresist may used to cover portions of the core region while leaving exposed the regions of the substrate to which a source/drain implant is incorporated. That is, a photoresist is deposited over the substrate 12 and patterned to form a source/drain mask 18 (areas of the partially formed charge trapping dielectric directly over the subsequently formed buried bitlines are exposed by the patterned photoresist). In this aspect of the invention, all or substantially all of the periphery region (not shown) of the substrate 12 is masked.

After the photoresist is patterned in the core region to facilitate/correspond to the formation of the source/drain regions, ions are implanted into the substrate 12, as shown by the arrows, forming implanted regions 20 in the substrate 12 directly below openings in the patterned photoresist. The semiconductor structure 10 is optionally annealed at a suitable temperature after implantation.

One or more suitable implantation materials may be employed. The selection of implantation materials primarily depends on the type of device desired, for example, whether a p-type or n-type is used. Examples of implantation materials include one or more of arsenic, boron, $BF_2^-$, antimony, indium, and phosphorus. In one embodiment, an n-type dopant is employed for implantation. In another embodiment, a p-type dopant is employed for implantation. Implantation is conducted to achieve a suitable dosage.

The implantation materials are implanted at a dosage suitable to form source/drain regions in the substrate 12. In one embodiment, the implantation materials are implanted at a dosage from about $1\times10^{14}$ to about $1\times10^{16}$ atoms/cm². In another embodiment, the implantation materials are implanted at a dosage from about $5\times10^{14}$ to about $7\times10^{15}$ atoms/cm². In yet another embodiment, the implantation materials are implanted at a dosage from about $1\times10^{15}$ to about $5\times10^{15}$ atoms/cm².

Implanted regions 20, form the source/drains of the memory cells in the resultant SONOS type nonvolatile memory device. The width of the implanted regions 20 at least substantially corresponds to the width of the openings in the source/drain mask 18. In one embodiment, the width of the implanted regions 20 (and the subsequently formed source/drains) is from about 0.1 μm to about 1.5 μm. In another embodiment, the width of the implanted regions 20 is from about 0.12 μm to about 1 μm. In yet another embodiment, the width of the implanted regions 20 is from about 0.14 μm to about 0.75 μm.

Referring to FIG. 4, the source/drain mask 18 is stripped or removed from the structure 10. After stripping the source/drain mask 18, the silicon nitride layer 16 is optionally cleaned. Subsequently, another silicon dioxide layer 22 is formed over silicon nitride layer 16. The silicon dioxide layer 22 is provided using any suitable means, such as CVD, including LPCVD and PECVD, dry oxidation, wet oxidation or rapid thermal oxidation. The second silicon dioxide layer 22 is formed in the same manner or a different manner as the first silicon dioxide layer 14.

Although not shown, further processing is performed to complete the fabrication of SONOS type flash memory devices. For example, polysilicon gates/wordlines are formed over the structure, periphery source/drain regions and gates are doped, spacers are formed, salicidation, completion of formation of SONOS type flash memory cells, select gates, high voltage gates, and low voltage gates, and so on. Using peripheral decoders and control circuitry, each memory cell formed in the core region can be addressed for programming, reading or erasing functions.

Figure 5:
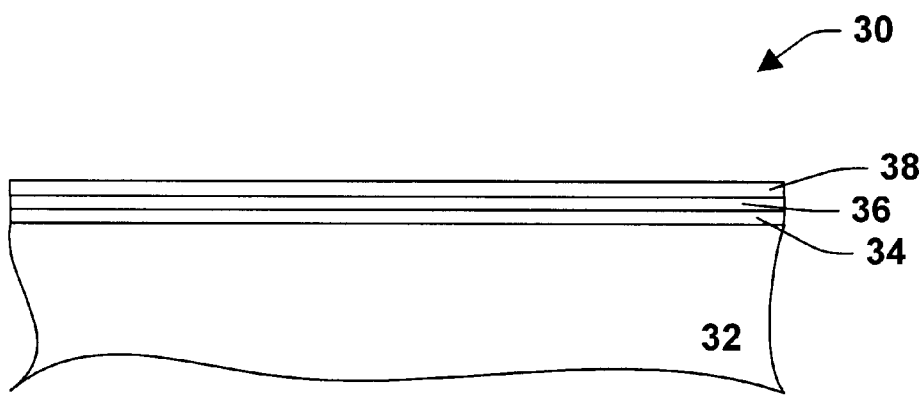
FIG. 5 illustrates a cross-sectional view of a second method of forming a SONOS type nonvolatile memory device in accordance with one aspect of the present invention.

Referring to FIGS. 5 to 8, another aspect of the present invention is specifically described. Referring to FIG. 5, a semiconductor structure 30 is shown. Semiconductor substrate 32 contains two regions, the core region containing the memory cells and the periphery region containing the rest of the chip such as the controlling logic and input/output devices. Processing activity in the core region is highlighted in FIGS. 5 to 8.

A silicon dioxide layer 34 is formed over the silicon substrate 32. The silicon dioxide layer 34 is provided using any suitable means, such as CVD, including LPCVD and PECVD, dry oxidation, wet oxidation or rapid thermal oxidation. A silicon nitride layer 36 is formed over the silicon dioxide layer 34. The silicon nitride layer 36 is provided using any suitable means, such as CVD, including LPCVD and PECVD. Another silicon dioxide layer 38 is formed over silicon nitride layer 36. The silicon dioxide layer 38 is provided using any suitable means, such as CVD, including LPCVD and PECVD, dry oxidation, wet oxidation or rapid thermal oxidation. The second silicon dioxide layer 38 is formed in the same manner or a different manner as the first silicon dioxide layer 34. The second silicon dioxide layer 38 is fully or partially formed.

Figure 6:
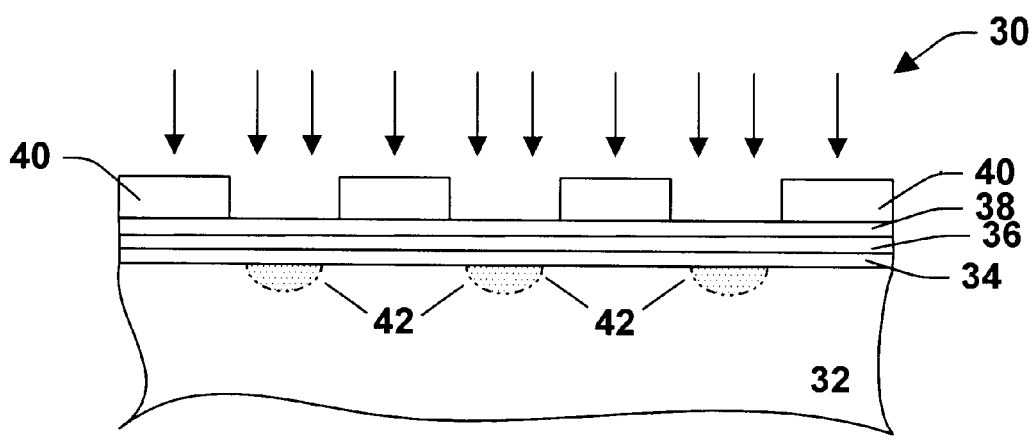
FIG. 6 illustrates another cross-sectional view of a second method of forming a SONOS type nonvolatile memory device in accordance with one aspect of the present invention.

Referring to FIG. 6, a source/drain mask 40 is provided over the second silicon dioxide layer 38 by any suitable means. For example, a photoresist may used to cover portions of the core region while leaving exposed the regions of the substrate to which a source/drain implant is incorporated. That is, a photoresist is deposited over the substrate 32 and patterned to form a source/drain mask 40 (areas of the fully or partially formed charge trapping dielectric directly over the subsequently formed buried bitlines are exposed by the patterned photoresist). In this aspect of the invention, all or substantially all of the periphery region (not shown) of the substrate 32 is masked.

After the photoresist is patterned in the core region to facilitate/correspond to the formation of the source/drain regions, ions are implanted into the substrate 32, as shown by the arrows, forming implanted regions 42 in the substrate 32 directly below openings in the patterned photoresist. The semiconductor structure 30 is optionally annealed at a suitable temperature after implantation.

One or more suitable implantation materials may be employed. The selection of implantation materials primarily depends on the type of device desired, for example, whether a p-type or n-type is used. Examples of implantation materials include one or more of arsenic, boron, $BF_2^-$, antimony, indium, and phosphorus. In one embodiment, an n-type dopant is employed for implantation. In another embodiment, a p-type dopant is employed for implantation. Implantation is conducted to achieve a suitable dosage.

The implantation materials are implanted at a dosage suitable to form source/drain regions in the substrate 32. In one embodiment, the implantation materials are implanted at a dosage from about $1\times10^{14}$ to about $1\times10^{16}$ atoms/cm². In another embodiment, the implantation materials are implanted at a dosage from about $5\times10^{14}$ to about $7\times10^{15}$ atoms/cm². In yet another embodiment, the implantation materials are implanted at a dosage from about $1\times10^{15}$ to about $5\times10^{15}$ atoms/cm².

Implanted regions 42, form the source/drains of the memory cells in the resultant SONOS type nonvolatile memory device. The width of the implanted regions 42 at least substantially corresponds to the width of the openings in the source/drain mask 40. In one embodiment, the width of the implanted regions 42 (and the subsequently formed source/drains) is from about 0.1 μm to about 1.5 μm. In another embodiment, the width of the implanted regions 42 is from about 0.12 μm to about 1μm. In yet another embodiment, the width of the implanted regions 42 is from about 0.14 μm to about 0.75 μm.

Figure 7:
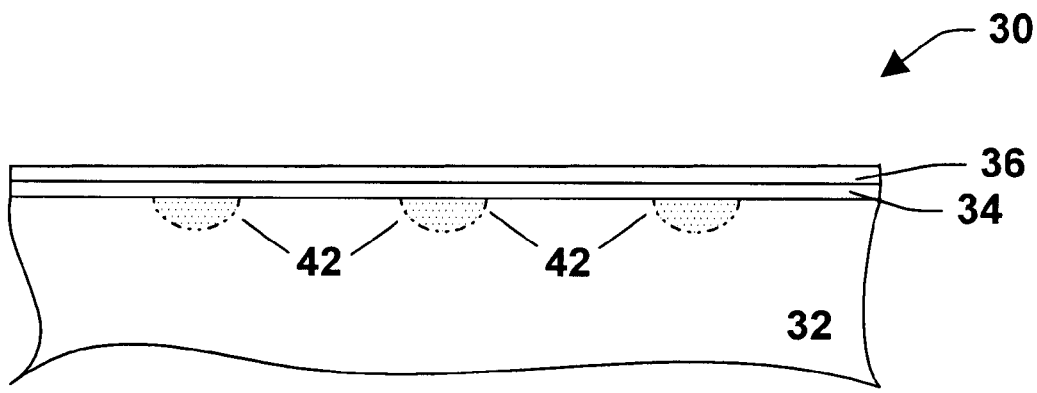
FIG. 7 illustrates yet another cross-sectional view of a second method of forming a SONOS type nonvolatile memory device in accordance with one aspect of the present invention.

Referring to FIG. 7, the source/drain mask 40 is stripped or removed from the structure 30. After stripping the source/drain mask 40, the second silicon dioxide layer 38 is optionally cleaned. Once the source/drain mask 40 is stripped, the second silicon dioxide layer 38 is removed from the structure by any suitable means. Wet etching, dry etching, plasma etching, or acidic etching may be employed to remove the second silicon dioxide layer 38 from the structure 30. After removing the second silicon dioxide layer 38, the silicon nitride layer 36 is optionally cleaned.

Figure 8:
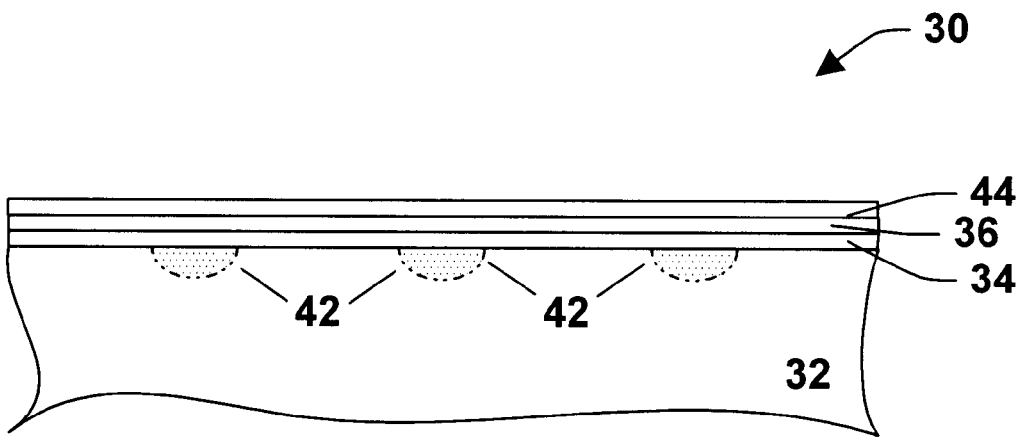
FIG. 8 illustrates still yet another cross-sectional view of a second method of forming a SONOS type nonvolatile memory device in accordance with one aspect of the present invention.

Referring to FIG. 8, another silicon dioxide layer 44 is formed over silicon nitride layer 36. The silicon dioxide layer 44 is provided using any suitable means, such as CVD, including LPCVD and PECVD, dry oxidation, wet oxidation or rapid thermal oxidation. The third silicon dioxide layer 44 is formed in the same manner or a different manner as the first silicon dioxide layer 34.

Although not shown, further processing is performed to complete the fabrication of SONOS type flash memory devices. For example, polysilicon gates/wordlines are formed over the structure, periphery source/drain regions and gates are doped, spacers are formed, salicidation, completion of formation of SONOS type flash memory cells, select gates, high voltage gates, and low voltage gates, and so on. Using peripheral decoders and control circuitry, each memory cell formed in the core region can be addressed for programming, reading or erasing functions.

Figure 9:
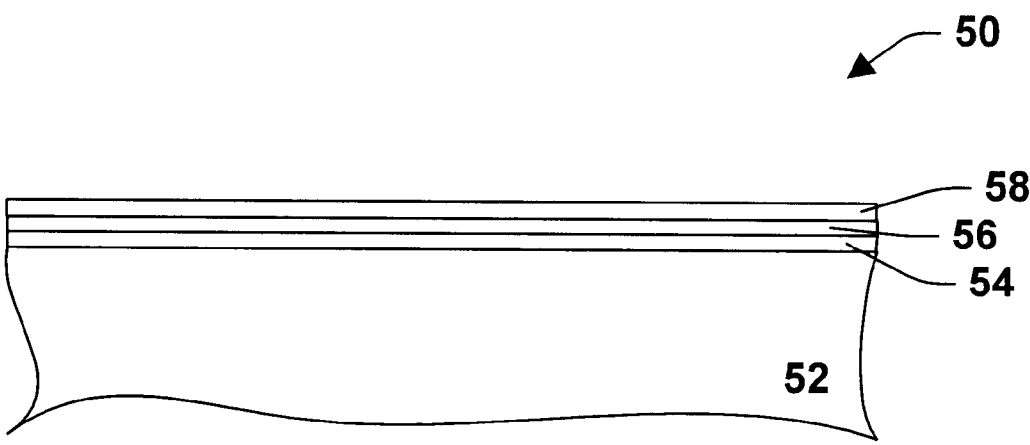
FIG. 9 illustrates a cross-sectional view of a third method of forming a SONOS type nonvolatile memory device in accordance with one aspect of the present invention.
Figure 10:
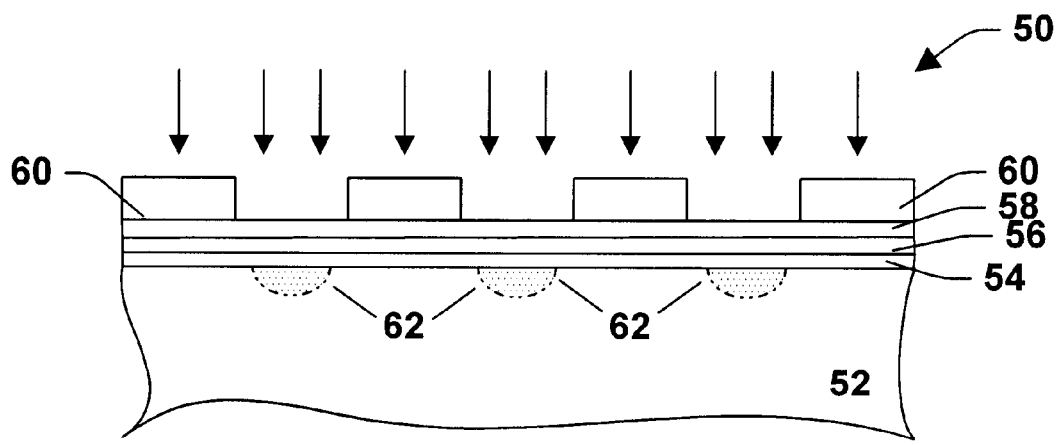
FIG. 10 illustrates another cross-sectional view of a third method of forming a SONOS type nonvolatile memory device in accordance with one aspect of the present invention.
Figure 11:
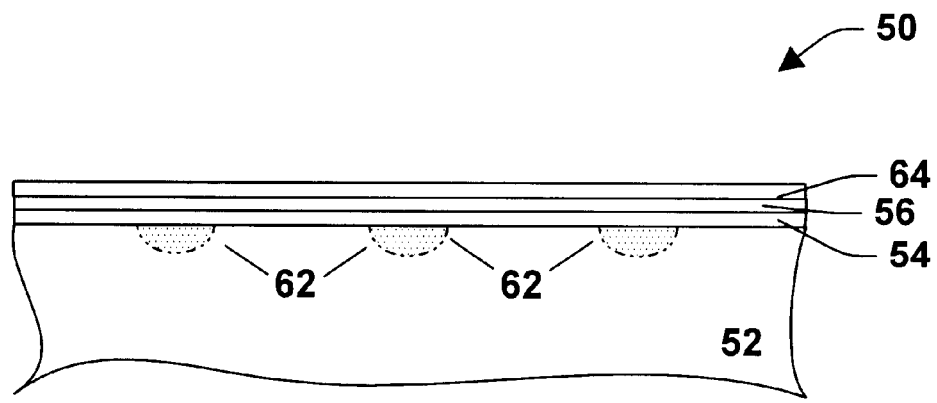
FIG. 11 illustrates yet another cross-sectional view of a third method of forming a SONOS type nonvolatile memory device in accordance with one aspect of the present invention.

Referring to FIGS. 9 to 11, yet another aspect of the present invention is specifically described. Referring to FIG. 9, a semiconductor structure 50 is shown. Semiconductor substrate 52 contains two regions, the core region containing the memory cells and the periphery region containing the rest of the chip such as the controlling logic and input/output devices. Processing activity in the core region is highlighted in FIGS. 9 to 11.

A silicon dioxide layer 54 is formed over the silicon substrate 52. The silicon dioxide layer 54 is provided using any suitable means, such as CVD, including LPCVD and PECVD, dry oxidation, wet oxidation or rapid thermal oxidation. A silicon nitride layer 56 is formed over the silicon dioxide layer 54. The silicon nitride layer 56 is provided using any suitable means, such as CVD, including LPCVD and PECVD. Another silicon dioxide layer 58 is formed over silicon nitride layer 56. The silicon dioxide layer 58 is provided using any suitable means, such as CVD, including LPCVD and PECVD, dry oxidation, wet oxidation or rapid thermal oxidation. The second silicon dioxide layer 58 is formed in the same manner or a different manner as the first silicon dioxide layer 54. The second silicon dioxide layer 58 is fully or partially formed.

Referring to FIG. 10, a source/drain mask 60 is provided over the second silicon dioxide layer 58 by any suitable means. For example, a photoresist may used to cover portions of the core region while leaving exposed the regions of the substrate to which a source/drain implant is incorporated. That is, a photoresist is deposited over the substrate 52 and patterned to form a source/drain mask 60 (areas of the fully or partially formed charge trapping dielectric directly over the subsequently formed buried bitlines are exposed by the patterned photoresist). In this aspect of the invention, all or substantially all of the periphery region (not shown) of the substrate 52 is masked.

After the photoresist is patterned in the core region to facilitate/correspond to the formation of the source/drain regions, ions are implanted into the substrate 52, as shown by the arrows, forming implanted regions 62 in the substrate 52 directly below openings in the patterned photoresist. The semiconductor structure 50 is optionally annealed at a suitable temperature after implantation.

One or more suitable implantation materials may be employed. The selection of implantation materials primarily depends on the type of device desired, for example, whether a p-type or n-type is used. Examples of implantation materials include one or more of arsenic, boron, $BF_2^+$, antimony, indium, and phosphorus. In one embodiment, an n-type dopant is employed for implantation. In another embodiment, a p-type dopant is employed for implantation. Implantation is conducted to achieve a suitable dosage.

The implantation materials are implanted at a dosage suitable to form source/drain regions in the substrate 52. In one embodiment, the implantation materials are implanted at a dosage from about $1 \times 10^{14}$ to about $1 \times 10^{16}$ atoms/cm$^2$. In another embodiment, the implantation materials are implanted at a dosage from about $5 \times 10^{14}$ to about $7 \times 10^{15}$ atoms/cm$^2$. In yet another embodiment, the implantation materials are implanted at a dosage from about $1 \times 10^{15}$ to about $5 \times 10^{15}$ atoms/cm$^2$.

Implanted regions 62, form the source/drains of the memory cells in the resultant SONOS type nonvolatile memory device. The width of the implanted regions 62 at least substantially corresponds to the width of the openings in the source/drain mask 60. In one embodiment, the width of the implanted regions 62 (and the subsequently formed source/drains) is from about 0.1 μm to about 1.5 μm. In another embodiment, the width of the implanted regions 62 is from about 0.12 μm to about 1 μm. In yet another embodiment, the width of the implanted regions 62 is from about 0.14 μm to about 0.75 μm.

Referring to FIG. 11, the source/drain mask 60 is stripped or removed from the structure 50. After stripping the source/drain mask 60, the second silicon dioxide layer is optionally cleaned. Additional silicon dioxide material is formed over the second silicon dioxide layer to provide silicon dioxide layer 64 over silicon nitride layer 56. The additional silicon dioxide material used to form the silicon dioxide layer 64 is provided using any suitable means, such as CVD, including LPCVD and PECVD, dry oxidation, wet oxidation or rapid thermal oxidation. The additional silicon dioxide material is provided in the same manner or a different manner as the first silicon dioxide layer 54 and/or in the same manner or a different manner as the second silicon dioxide layer 58.

Although not shown, further processing is performed to complete the fabrication of SONOS type flash memory devices. For example, polysilicon gates/wordlines are formed over the structure, periphery source/drain regions and gates are doped, spacers are formed, salicidation, completion of formation of SONOS type flash memory cells, select gates, high voltage gates, and low voltage gates, and so on. Using peripheral decoders and control circuitry, each memory cell formed in the core region can be addressed for programming, reading or erasing functions.

Figure 12:
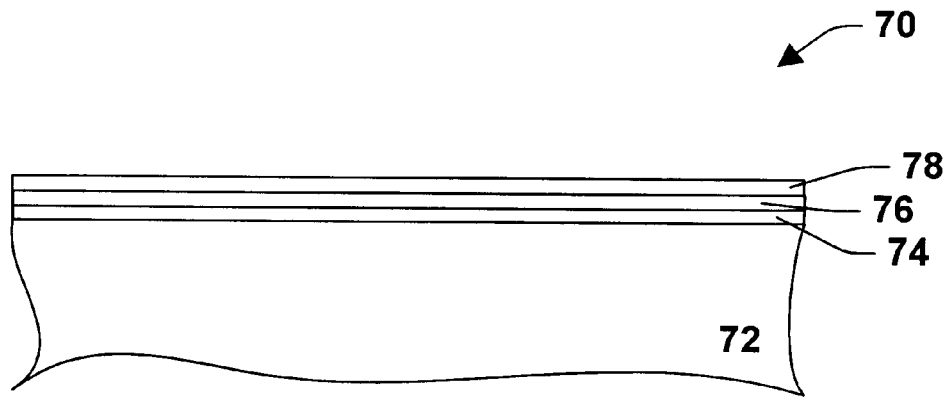
FIG. 12 illustrates a cross-sectional view of a fourth method of forming a SONOS type nonvolatile memory device in accordance with one aspect of the present invention.

Referring to FIGS. 12 to 15, still yet another aspect of the present invention is specifically described. Referring to FIG. 12, a semiconductor structure 70 is shown. Semiconductor substrate 72 contains two regions, the core region containing the memory cells and the periphery region containing the rest of the chip such as the controlling logic and input/output devices. Processing activity in the core region is highlighted in FIGS. 12 to 15.

A silicon dioxide layer 74 is formed over the silicon substrate 72. The silicon dioxide layer 74 is provided using any suitable means, such as CVD, including LPCVD and PECVD, dry oxidation, wet oxidation or rapid thermal oxidation. A silicon nitride layer 76 is formed over the silicon dioxide layer 74. The silicon nitride layer 76 is provided using any suitable means, such as CVD, including LPCVD and PECVD. Another silicon dioxide layer 78 is formed over silicon nitride layer 76. The silicon dioxide layer 78 is provided using any suitable means, such as CVD, including LPCVD and PECVD, dry oxidation, wet oxidation or rapid thermal oxidation. The second silicon dioxide layer 78 is formed in the same manner or a different manner as the first silicon dioxide layer 74. The second silicon dioxide layer 78 is fully or partially formed.

Figure 13:
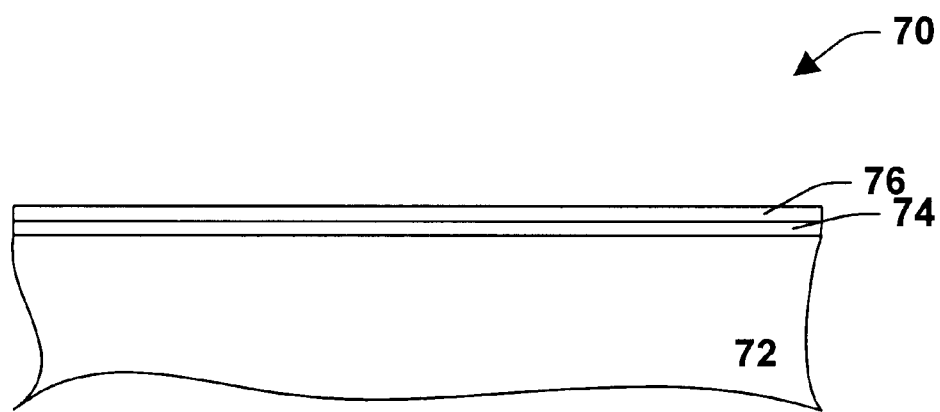
FIG. 13 illustrates another cross-sectional view of a fourth method of forming a SONOS type nonvolatile memory device in accordance with one aspect of the present invention.

Referring to FIG. 13, the second silicon dioxide layer 78, which is fully or partially formed, is removed or stripped from the structure by any suitable means. Wet etching, dry etching, plasma etching, or acidic etching may be employed to remove the second silicon dioxide layer 78 from the structure 70. After removing the second silicon dioxide layer 78, the silicon nitride layer 76 is optionally cleaned.

Figure 14:
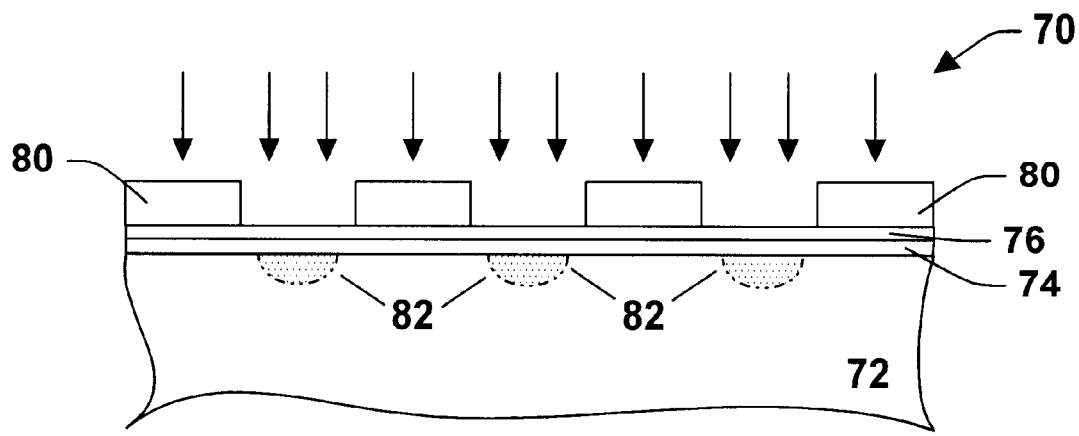
FIG. 14 illustrates yet another cross-sectional view of a fourth method of forming a SONOS type nonvolatile memory device in accordance with one aspect of the present invention.

Referring to FIG. 14, a source/drain mask 80 is provided over the silicon nitride layer 76 by any suitable means. For example, a photoresist may used to cover portions of the core region while leaving exposed the regions of the substrate to which a source/drain implant is incorporated. That is, a photoresist is deposited over the substrate 72 and patterned to form a source/drain mask 80 (areas of the partially formed charge trapping dielectric directly over the subsequently formed buried bitlines are exposed by the patterned photoresist). In this aspect of the invention, all or substantially all of the periphery region (not shown) of the substrate 72 is masked.

After the photoresist is patterned in the core region to facilitate/correspond to the formation of the source/drain regions, ions are implanted into the substrate 72, as shown by the arrows, forming implanted regions 82 in the substrate 72 directly below openings in the patterned photoresist. The semiconductor structure 70 is optionally annealed at a suitable temperature after implantation.

One or more suitable implantation materials may be employed. The selection of implantation materials primarily depends on the type of device desired, for example, whether a p-type or n-type is used. Examples of implantation materials include one or more of arsenic, boron, $BF_2^-$, antimony, indium, and phosphorus. In one embodiment, an n-type dopant is employed for implantation. In another embodiment, a p-type dopant is employed for implantation. Implantation is conducted to achieve a suitable dosage.

The implantation materials are implanted at a dosage suitable to form source/drain regions in the substrate 72. In one embodiment, the implantation materials are implanted at a dosage from about $1 \times 10^{14}$ to about $1 \times 10^{16}$ atoms/cm². In another embodiment, the implantation materials are implanted at a dosage from about $5 \times 10^{14}$ to about $7 \times 10^{15}$ atoms/cm². In yet another embodiment, the implantation materials are implanted at a dosage from about $1 \times 10^{15}$ to about $5 \times 10^{15}$ atoms/cm².

Implanted regions 82, form the source/drains of the memory cells in the resultant SONOS type nonvolatile memory device. The width of the implanted regions 82 at least substantially corresponds to the width of the openings in the source/drain mask 80. In one embodiment, the width of the implanted regions 82 (and the subsequently formed source/drains) is from about 0.1 μm to about 1.5 μm. In another embodiment, the width of the implanted regions 82 is from about 0.12 μm to about 1 μm. In yet another embodiment, the width of the implanted regions 82 is from about 0.14 μm to about 0.75 μm.

Figure 15:
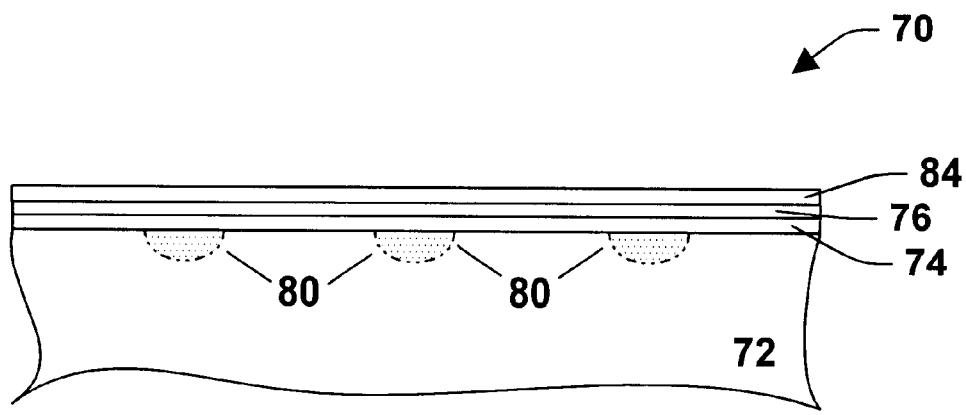
FIG. 15 illustrates still yet another cross-sectional view of a second method of forming a SONOS type nonvolatile memory device in accordance with one aspect of the present invention.

Referring to FIG. 15, the source/drain mask 80 is stripped or removed from the structure 70. After stripping the source/drain mask 80, the silicon nitride layer 76 is optionally cleaned. Subsequently, another silicon dioxide layer 84 is formed over silicon nitride layer 76. The silicon dioxide layer 84 is provided using any suitable means, such as CVD, including LPCVD and PECVD, dry oxidation, wet oxidation or rapid thermal oxidation. The second silicon dioxide layer 84 is formed in the same manner or a different manner as the first silicon dioxide layer 74.

Although not shown, further processing is performed to complete the fabrication of SONOS type flash memory devices. For example, polysilicon gates/wordlines are formed over the structure, periphery source/drain regions and gates are doped, spacers are formed, salicidation, completion of formation of SONOS type flash memory cells, select gates, high voltage gates, and low voltage gates, and so on. Using peripheral decoders and control circuitry, each memory cell formed in the core region can be addressed for programming, reading or erasing functions.

Although the invention has been shown and described with respect to a certain embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. In a method of forming a SONOS type non-volatile semiconductor memory device, the improvement comprising:

forming a first layer of a charge trapping dielectric on a semiconductor substrate;

forming a second layer of the charge trapping dielectric over the first layer of the charge trapping dielectric on the semiconductor substrate;

optionally at least partially forming a third layer of the charge trapping dielectric over the second layer of the charge trapping dielectric on the semiconductor substrate:

optionally removing the third layer of the charge trapping dielectric;

forming a source/drain mask over the charge trapping dielectric;

implanting a source/drain implant through the charge trapping dielectric into the semiconductor substrate;

optionally removing the third layer of the charge trapping dielectric; and one of forming the third layer of the charge trapping dielectric over the second layer of the charge trapping dielectric on the semiconductor substrate, reforming the third layer of the charge trapping dielectric over the second layer of the charge trapping dielectric on the semiconductor substrate, or forming additional material over the third layer of the charge trapping dielectric.

2. The method according to claim 1, wherein the first layer of the charge trapping dielectric comprises silicon dioxide, the second layer of the charge trapping dielectric comprises silicon nitride, and the third layer of the charge trapping dielectric comprises silicon dioxide.

3. The method according to claim 1, wherein the third layer of the charge trapping dielectric is formed over the second layer of the charge trapping dielectric after implanting the source/drain implant.

4. The method according to claim 1, wherein the third layer of the charge trapping dielectric is at least partially formed over the second layer of the charge trapping dielectric before forming the source/drain mask, the third layer of the charge trapping dielectric is removed after implanting the source/drain implant, and the third layer of the charge trapping dielectric is reformed over the second layer of the charge trapping dielectric.

5. The method according to claim 1, wherein the third layer of the charge trapping dielectric is at least partially formed over the second layer of the charge trapping dielectric before forming the source/drain mask, and additional material is formed over the third layer of the charge trapping dielectric after implanting the source/drain implant.

6. The method according to claim 1, wherein the source/drain implant comprises at least one of arsenic, boron, $BF_2^+$, antimony, indium, and phosphorus implanted from a minimum dosage of about $1 \times 10^{14}$ or more to a maximum dosage of about $1 \times 10^{16}$ atoms/cm$^2$ or less.

7. A method of forming a charge trapping dielectric and source/drain regions in a core region of a SONOS type non-volatile semiconductor memory device, comprising:
   forming a first layer of the charge trapping dielectric on a semiconductor substrate;
   forming a second layer of the charge trapping dielectric over the first layer of the charge trapping dielectric on the semiconductor substrate;
   optionally at least partially forming a third layer of the charge trapping dielectric over the second layer of the charge trapping dielectric on the semiconductor substrate;
   optionally removing the third layer of the charge trapping dielectric;
   patterning a photoresist over the charge trapping dielectric;
   implanting at least one of arsenic, boron, $BF_2^+$, antimony, indium, and phosphorus through the charge trapping dielectric into the semiconductor substrate;
   optionally removing the third layer of the charge trapping dielectric; and
   one of forming the third layer of the charge trapping dielectric over the second layer of the charge trapping dielectric on the semiconductor substrate, reforming the third layer of the charge trapping dielectric over the second layer of the charge trapping dielectric on the semiconductor substrate, or forming additional material over the third layer of the charge trapping dielectric.

8. The method according to claim 7, wherein the charge trapping dielectric has a minimum thickness of about 75 Å or more and a maximum thickness of about 300 Å or less.

9. The method according to claim 7, wherein the third layer of the charge trapping dielectric is formed over the second layer of the charge trapping dielectric after implanting at least one of arsenic, boron, $BF_2^+$, antimony, indium, and phosphorus.

10. The method according to claim 7, wherein the third layer of the charge trapping dielectric is at least partially formed over the second layer of the charge trapping dielectric before patterning the photoresist, the third layer of the charge trapping dielectric is removed after implanting at least one of arsenic, boron, $BF_2^+$, antimony, indium, and phosphorus, and the third layer of the charge trapping dielectric is reformed over the second layer of the charge trapping dielectric.

11. The method according to claim 7, wherein the third layer of the charge trapping dielectric is at least partially formed over the second layer of the charge trapping dielectric before patterning the photoresist, and additional material is formed over the third layer of the charge trapping dielectric after implanting at least one of arsenic, boron, $BF_2^+$, antimony, indium, and phosphorus.

12. The method according to claim 7, wherein the charge trapping dielectric comprises one selected from the group consisting of an ONO trilayer dielectric, an oxide/tantalum oxide/oxide trilayer dielectric, an oxide/strontium titanate/oxide trilayer dielectric, an oxide/strontium titanate/barium strontium titanate trilayer dielectric, and an oxide/hafnium oxide/oxide trilayer dielectric.

13. The method according to claim 7, wherein the first layer of the charge trapping dielectric comprises silicon dioxide or nitrided silicon dioxide, the second layer of the charge trapping dielectric comprises silicon nitride or silicon-rich silicon nitride, and the third layer of the charge trapping dielectric comprises silicon dioxide or nitrided silicon dioxide.

14. The method according to claim 7, wherein the first layer of the charge trapping dielectric has a thickness from about 50 Å to about 150 Å, the second layer of the charge trapping dielectric has a thickness from about 20 Å to about 80 Å, and the third layer of the charge trapping dielectric has a thickness from about 50 Å to about 150 Å.

15. The method according to claim 7, wherein the third layer of the charge trapping dielectric is at least partially formed over the second layer of the charge trapping dielectric before patterning the photoresist, the third layer of the charge trapping dielectric is removed before implanting at least one of arsenic, boron, $BF_2^+$, antimony, indium, and phosphorus, and the third layer of the charge trapping dielectric is reformed over the second layer of the charge trapping dielectric.

16. In a method of forming a SONOS type non-volatile semiconductor memory device, the improvement comprising:
   forming a first oxide layer of an ONO charge trapping dielectric on a semiconductor substrate;
   forming a nitride layer of the ONO charge trapping dielectric over the first oxide layer of the ONO charge trapping dielectric on the semiconductor substrate;
   optionally at least partially forming a second oxide layer of the ONO charge trapping dielectric over the nitride layer of the ONO charge trapping dielectric on the semiconductor substrate;
   optionally removing the second oxide layer of the ONO charge trapping dielectric;
   forming a source/drain mask over the ONO charge trapping dielectric;
   implanting a source/drain implant through the ONO charge trapping dielectric into the semiconductor substrate;
   optionally removing the second oxide layer of the ONO charge trapping dielectric; and
   one of forming the second oxide layer of the ONO charge trapping dielectric over the nitride layer of the ONO charge trapping dielectric on the semiconductor substrate, reforming the second oxide layer of the ONO charge trapping dielectric over the nitride layer of the ONO charge trapping dielectric on the semiconductor substrate, or forming additional oxide material over the second oxide layer of the ONO charge trapping dielectric.

17. The method according to claim 16, wherein the second oxide layer of the ONO charge trapping dielectric is formed over the nitride layer of the ONO charge trapping dielectric after implanting the source/drain implant.

18. The method according to claim 16, wherein the second oxide layer of the ONO charge trapping dielectric is at least partially formed over the nitride layer of the ONO charge trapping dielectric before forming the source/drain mask, the second oxide layer of the ONO charge trapping dielectric is removed after implanting the source/drain implant, and the second oxide layer of the ONO charge trapping dielectric is reformed over the nitride layer of the ONO charge trapping dielectric.

19. The method according to claim 16, wherein the second oxide layer of the ONO charge trapping dielectric is at least partially formed over the nitride layer of the ONO charge trapping dielectric before forming the source/drain mask, and additional oxide material is formed over the second oxide layer of the ONO charge trapping dielectric after implanting the source/drain implant.

20. The method according to claim 16, wherein the ONO charge trapping dielectric has a minimum thickness of about 100 Å or more and a maximum thickness of about 275 Å or less.

21. The method according to claim 16, wherein the source/drain implant comprises at least one of arsenic, boron, and phosphorus implanted from a minimum dosage of about $5 \times 10^{14}$ or more to a maximum dosage of about $7 \times 10^{15}$ atoms/cm$^2$ or less.

22. The method according to claim 16, wherein the second oxide layer of the ONO charge trapping dielectric is at least partially formed over the nitride layer of the ONO charge trapping dielectric before forming the source/drain mask, the second oxide layer of the ONO charge trapping dielectric is removed before forming the source/drain mask, and the second oxide layer of the ONO charge trapping dielectric is reformed over the nitride layer of the ONO charge trapping dielectric.

* * * * *